(12) United States Patent
Satoh et al.

(10) Patent No.: US 10,438,648 B2
(45) Date of Patent: Oct. 8, 2019

(54) APPARATUSES AND METHODS FOR MAINTAINING A DUTY CYCLE ERROR COUNTER

(71) Applicant: MICRON TECHNOLOGY, INC., Boise, ID (US)

(72) Inventors: Yasuo Satoh, Tsukuba (JP); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 15/868,232

(22) Filed: Jan. 11, 2018

(65) Prior Publication Data

US 2019/0214072 A1   Jul. 11, 2019

(51) Int. Cl.
| | | |
|---|---|---|
| G11C 11/4076 | (2006.01) | |
| H03K 3/017 | (2006.01) | |
| H03K 23/00 | (2006.01) | |
| H03M 7/16 | (2006.01) | |
| G11C 29/02 | (2006.01) | |
| H03K 19/21 | (2006.01) | |

(52) U.S. Cl.
CPC ........ *G11C 11/4076* (2013.01); *G11C 29/023* (2013.01); *H03K 3/017* (2013.01); *H03K 23/005* (2013.01); *H03M 7/16* (2013.01); *H03K 19/21* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,772,503 A | * | 11/1973 | Fowler | G01C 17/26 701/530 |
| 3,833,901 A | * | 9/1974 | Fowler | G01C 17/26 340/870.21 |
| 4,631,628 A | * | 12/1986 | Kissel | F02D 41/20 123/490 |
| 4,631,652 A | * | 12/1986 | Wendt | H01F 27/38 348/E5.127 |
| 4,916,374 A | * | 4/1990 | Schierbeek | B60S 1/0818 250/341.3 |
| 4,967,302 A | * | 10/1990 | Hutcheon | G08C 19/02 307/326 |
| 5,107,190 A | * | 4/1992 | Schultz | H02M 3/156 315/387 |
| 5,255,152 A | * | 10/1993 | Estes, III | H01H 47/325 327/172 |

(Continued)

*Primary Examiner* — Adam D Houston
(74) *Attorney, Agent, or Firm* — Dorsey & Whitney LLP

(57) ABSTRACT

Apparatuses and methods for maintaining a duty cycle error counter. An example apparatus may a duty cycle detect circuit configured to receive a clock signal and to detect a duty cycle error of the clock signal. The duty cycle detect error includes a counter configured to store a count value indicating the duty cycle error using Gray code. The counter is adjusted in response to detection of non-zero duty cycle error, and the counter is configured to convert the count value from Gray code to binary code as a binary count value. The duty cycle detect circuit is further configured to provide a duty cycle error signal based on the binary count value. The example apparatus further comprising a duty cycle correction circuit configured to adjust a duty cycle of the clock signal based on the duty cycle error signal.

19 Claims, 10 Drawing Sheets

(56) References Cited

U.S. PATENT DOCUMENTS

| | | | | |
|---|---|---|---|---|
| 6,275,023 B1 * | 8/2001 | Oosaki | G01R 31/31924 | 324/756.06 |
| 6,639,815 B1 * | 10/2003 | Gucyski | H02M 1/088 | 363/40 |
| 6,937,172 B1 * | 8/2005 | Lowe | G06F 5/14 | 341/97 |
| 7,148,825 B2 * | 12/2006 | Jiang | H03M 7/16 | 341/97 |
| 7,271,634 B1 * | 9/2007 | Daga | H03L 7/0812 | 327/149 |
| 7,528,582 B1 * | 5/2009 | Ferguson | H02J 7/0021 | 320/128 |
| 7,750,685 B1 * | 7/2010 | Bunch | H03L 7/087 | 327/23 |
| 7,826,122 B2 * | 11/2010 | Morishita | G02F 1/2255 | 359/239 |
| 8,842,766 B2 * | 9/2014 | Prathapan | G06F 1/10 | 327/291 |
| 10,249,354 B1 * | 4/2019 | Lee | G11C 7/22 | |
| 2002/0075047 A1 * | 6/2002 | Tsukikawa | G11C 7/22 | 327/156 |
| 2003/0039130 A1 * | 2/2003 | Curtiss | G05F 1/613 | 363/37 |
| 2004/0005021 A1 * | 1/2004 | Moon | H03L 7/091 | 375/355 |
| 2004/0095121 A1 * | 5/2004 | Kernahan | H02M 3/156 | 323/283 |
| 2004/0099788 A1 * | 5/2004 | Hedin | G01J 1/4257 | 250/205 |
| 2004/0210790 A1 * | 10/2004 | Moon | H03L 7/091 | 713/500 |
| 2004/0257005 A1 * | 12/2004 | Poehlman | H05B 41/2855 | 315/291 |
| 2005/0248964 A1 * | 11/2005 | Dalal | H02M 3/33592 | 363/21.08 |
| 2005/0258988 A1 * | 11/2005 | Jiang | H03M 7/16 | 341/97 |
| 2006/0094457 A1 * | 5/2006 | Song | H04W 52/0254 | 455/522 |
| 2006/0139189 A1 * | 6/2006 | Sadowsky | H03M 7/12 | 341/62 |
| 2007/0194821 A1 * | 8/2007 | Gomm | G11C 7/22 | 327/158 |
| 2009/0052256 A1 * | 2/2009 | Sutardja | G11C 8/08 | 365/185.19 |
| 2009/0096413 A1 * | 4/2009 | Partovi | H01F 5/003 | 320/108 |
| 2010/0134153 A1 * | 6/2010 | Zerbe | H04L 25/03006 | 327/108 |
| 2010/0164289 A1 * | 7/2010 | Umminger | H02J 1/10 | 307/55 |
| 2012/0075126 A1 * | 3/2012 | Baumgartl | G01R 33/36 | 341/97 |
| 2013/0176651 A1 * | 7/2013 | Burnham | H02H 1/003 | 361/56 |
| 2013/0278451 A1 * | 10/2013 | Kim | H03K 23/005 | 341/98 |
| 2014/0097790 A1 * | 4/2014 | Yeh | H02J 7/0029 | 320/108 |
| 2015/0084431 A1 * | 3/2015 | Yeh | H02J 7/0044 | 307/104 |
| 2015/0223305 A1 * | 8/2015 | Yang | H05B 33/0815 | 315/193 |
| 2015/0287444 A1 * | 10/2015 | Lee | G11C 7/08 | 713/322 |
| 2015/0295589 A1 * | 10/2015 | Eddleman | H03K 9/08 | 341/152 |
| 2015/0340880 A1 * | 11/2015 | Kdoshim | H02J 5/005 | 307/104 |
| 2016/0056639 A1 * | 2/2016 | Mao | H02J 50/80 | 307/104 |
| 2016/0134290 A1 * | 5/2016 | Pinoncely | H03K 23/005 | 341/164 |
| 2016/0299555 A1 * | 10/2016 | Rucker | H05B 33/0845 | |
| 2017/0012193 A1 * | 1/2017 | Jogia | H02J 50/05 | |
| 2017/0038736 A1 * | 2/2017 | Kawaguchi | G04C 3/14 | |
| 2017/0087997 A1 * | 3/2017 | Trunk | H02H 7/1255 | |
| 2017/0237917 A1 * | 8/2017 | Sato | H04N 5/3745 | 348/308 |
| 2017/0310121 A1 * | 10/2017 | Gong | H02J 7/007 | |
| 2018/0007758 A1 * | 1/2018 | Rucker | H05B 33/0815 | |
| 2018/0026538 A1 * | 1/2018 | Dalena | H02M 3/158 | 323/271 |
| 2018/0145242 A1 * | 5/2018 | Tamayama | G05F 1/46 | |
| 2018/0172758 A1 * | 6/2018 | Kashima | G01R 19/16566 | |
| 2018/0231590 A1 * | 8/2018 | Choi | G01R 19/14 | |
| 2018/0348075 A1 * | 12/2018 | Rubinstein | F17C 1/00 | |
| 2018/0351449 A1 * | 12/2018 | Hattori | H02M 7/155 | |
| 2019/0018816 A1 * | 1/2019 | Lee | G06F 13/4243 | |
| 2019/0037660 A1 * | 1/2019 | Rucker | H05B 33/0845 | |
| 2019/0056132 A1 * | 2/2019 | Warren | F24F 11/30 | |
| 2019/0081485 A1 * | 3/2019 | Kim | H02J 7/007 | |

* cited by examiner

FIG. 8A

APPARATUSES AND METHODS FOR MAINTAINING A DUTY CYCLE ERROR COUNTER

BACKGROUND

Current and future generation DRAM and SDRAM applications utilize very high I/O speeds. As a result, the clock speeds are also very high. The high clock speeds may make aligning phases and setting duty cycles of clocks challenging, as timing windows and margin for error are both very narrow, and updates occurring quickly, leading to frequent counter updates and opportunities for introduction of errors in a counter.

BRIEF DESCRIPTION OF THE DRAWINGS

FIGS. 8A-8C include tables that compare Gray code and binary code counter changes in accordance with embodiments of the disclosure.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
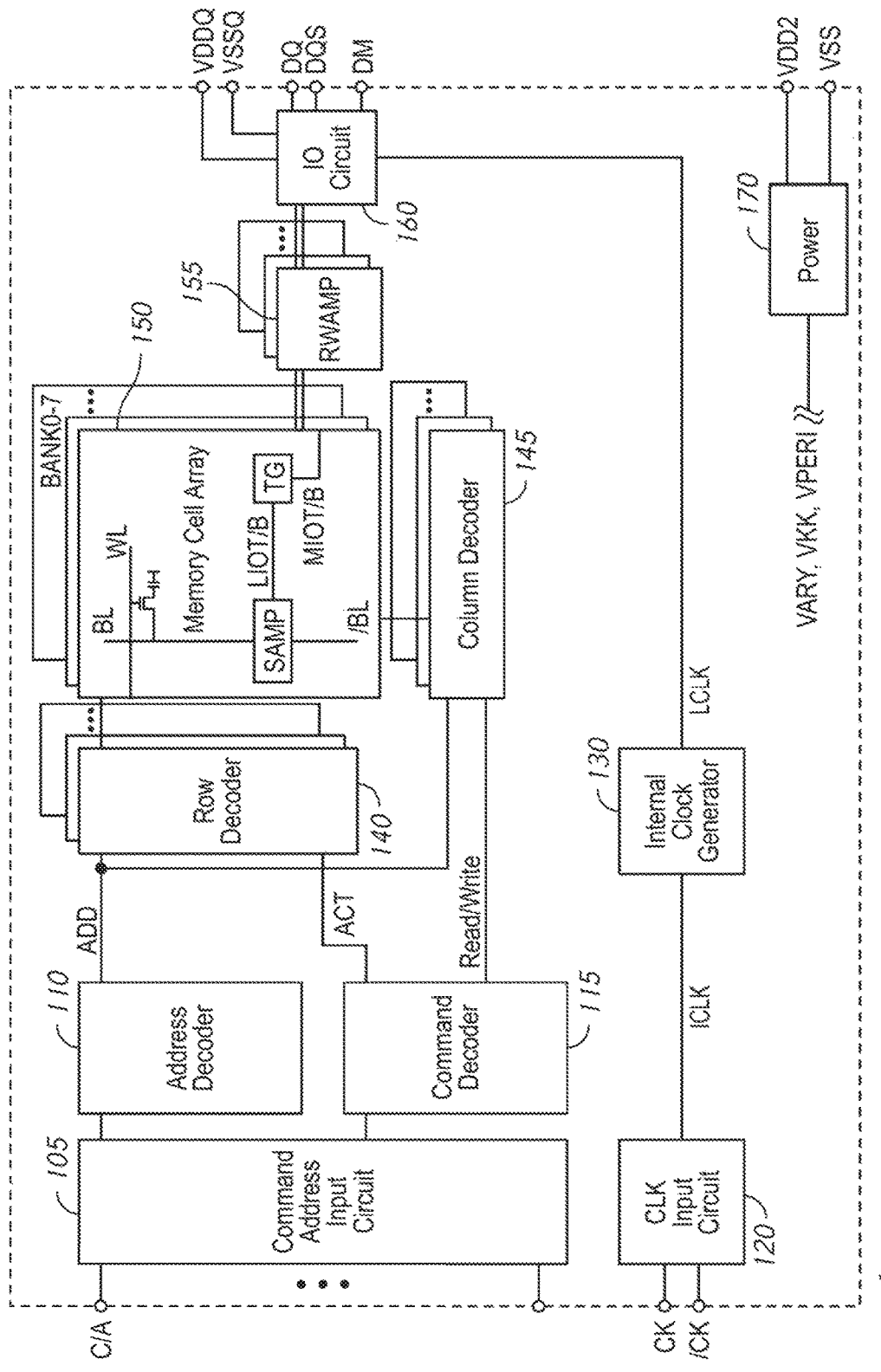
FIG. 1 illustrates a schematic block diagram of a semiconductor device according to an embodiment of the present disclosure.

FIG. 1 illustrates a schematic block diagram of a semiconductor device 100 in accordance with an embodiment of the present disclosure. The semiconductor device 100 includes a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, I/O circuit 160, and power circuit 170.

In some embodiments, the semiconductor device 100 may include, without limitation, a dynamic random-access memory (DRAM) device, such as double data rate (DDR) DDR4, DDR5, low power(LP) DDR, integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL and /BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and /BL, and are connected to at least one respective local I/O line LIOT/B, which is in turn coupled to a respective one of at least two main I/O line pairs MIOT/B, via transfer gates (TG), which function as switches.

The semiconductor device 100 may employ a plurality of external terminals that include address and command terminals coupled to command/address bus (C/A), clock terminals CK and /CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and supplies decoded address signals ADD to the row decoder 140 and the column decoder 145. The decoded address signals ADD may include a decoded row address signal provided to the row decoder 140, and a decoded column address signal provided to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal, such as a read command or a write command Read/Write, to select a bit line, and a test mode signal.

Accordingly, when a read command is issued and a row address and a column address are timely supplied with the read command, read data is read from a memory cell in the memory array 150 designated by these row address and column address. The read data DQ is output to outside from the data terminals DQ (data), DQS (data strobe), and DM (data mask) via read/write amplifiers 155 and an input/output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 120. The clock input circuit 120 may receive the external clock signals to generate an internal clock signal ICLK. The internal clock signal ICLK is supplied to an internal clock generator 130 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 130. The phase controlled internal clock signal LCLK is supplied to the input/output circuit 160 and is used as a timing signal for determining an output timing of read data. In some examples, the clock generator 130 includes a DCC circuit configured to correct a duty cycle of the LCLK signal. The DCC circuit may include a counter that adjusts the duty cycle of the LCLK signal. The counter may include logic to store values using Gray code and logic that converts the Gray code to binary code prior to output and converts received binary code to Gray code. Storing values in the counter using Gray code may make the DCC circuit less susceptible to catastrophic failure events caused by corruption of one or more bits within the counter. One cause of bit corruption in a counter is situations where many bits within the counter transition in a single adjustment (e.g., decrement or increment). By using Gray code to encode bits in the counter, only a single bit is changed per adjustment of the counter.

Figure 8A:
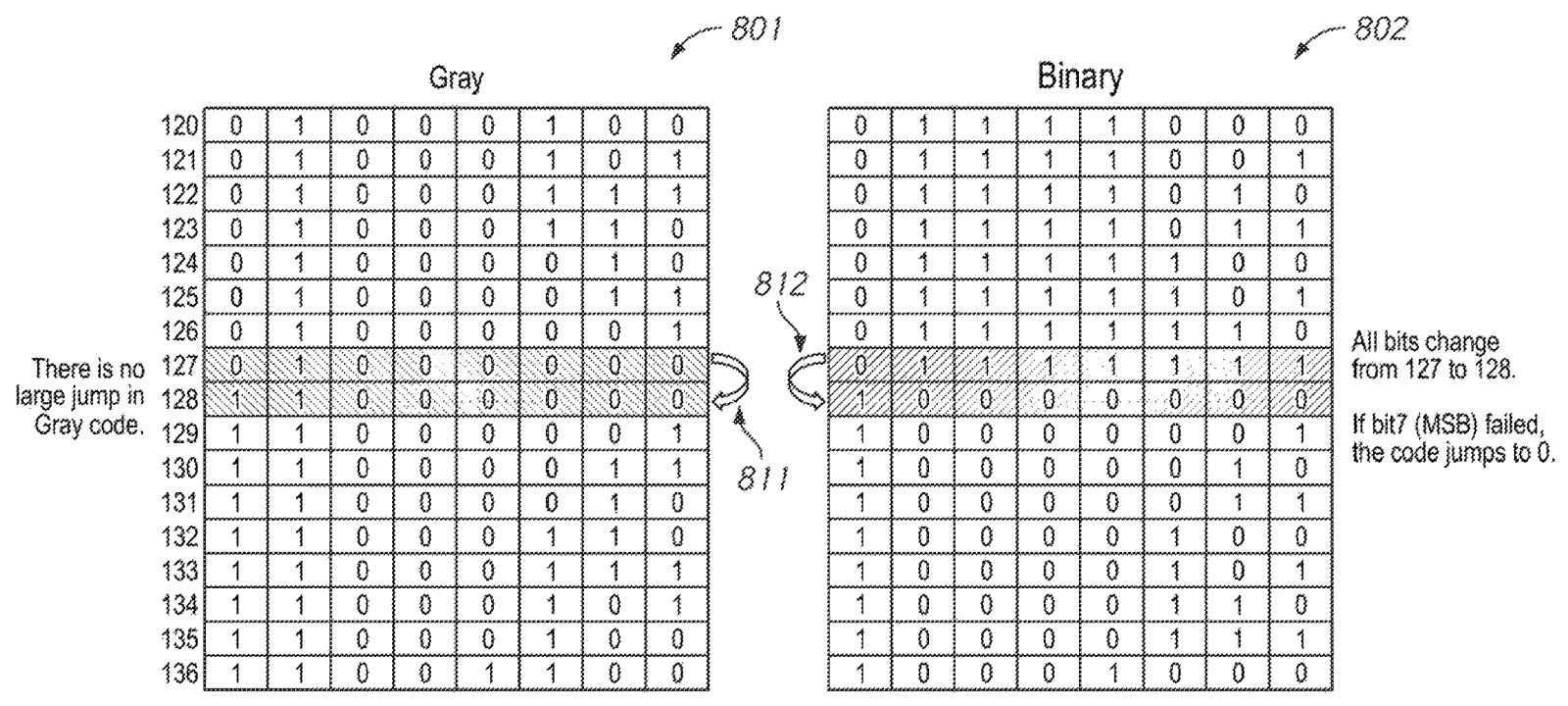
Figure 8B:
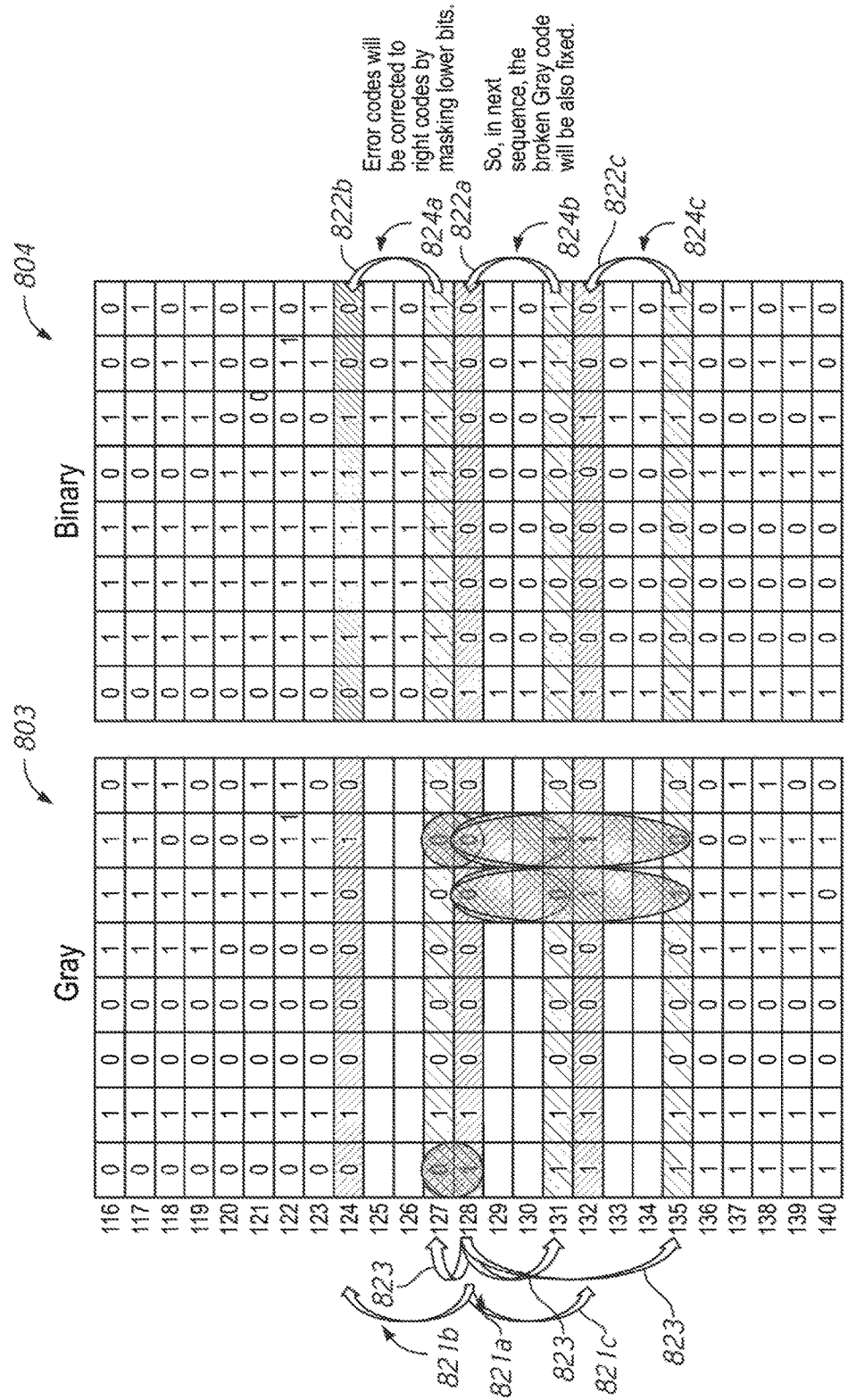
Figure 8C:
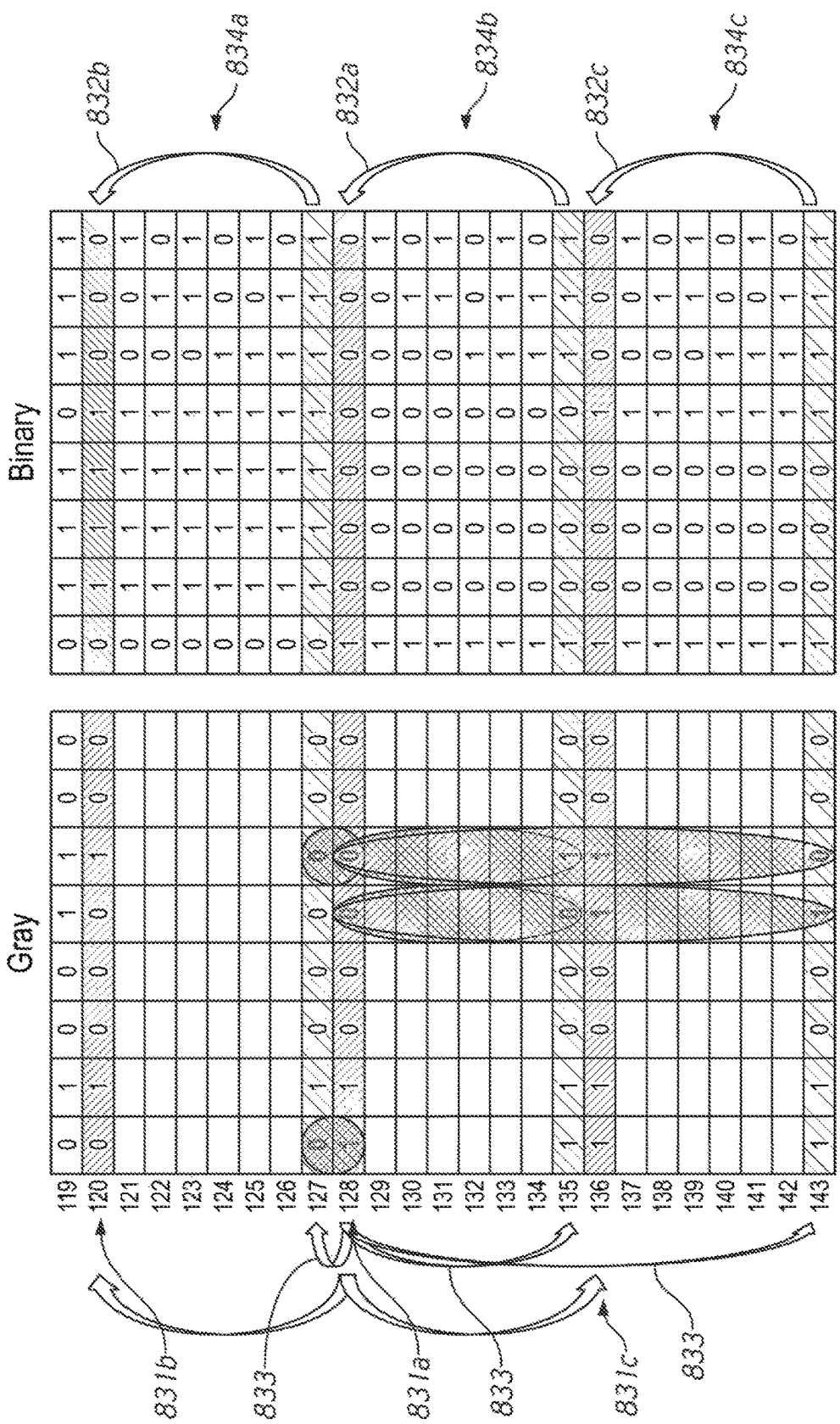

For example, FIGS. 8A-8C include tables 801-806 that compare Gray code and binary code counter changes in accordance with embodiments of the disclosure. For example, FIG. 8A depicts a Gray code table 801 showing ×1 value change and a binary code table 802 shows a corresponding ×1 value change. For example, in the Gray code table 801 and the binary code table 802, the counter value transitions from 127 to 128. In the Gray code table 801, the transition 811 shows that only a single bit changes, while the binary code table 802 shows the transition includes every bit changing. Because of the number of bits changing in the binary code example, the chances that a catastrophic error could occur are increased, where if an error occurs in the Gray code example, the value merely stays at 128.

FIG. 8B depicts a Gray code table 803 showing ×4 value change and a binary code table 804 shows a corresponding ×4 value change. In the Gray code table 803 and the binary code table 804, the counter value can transition from a starting point 821*a* of 128 to 124 (e.g., decrement 821*b*) or 132 (e.g., increment 821*c*). The potential errors 823 in the two bits changing are 127, 131, or 135, none of which would be likely to cause a catastrophic error. Further, as shown in the binary code table 804, even if the counter ended up being set to one of those three erroneous values, because the counter is in a ×4 mode, the two lower bits could be masked, allowing the values to be reset to one of the expected values or the previous starting value (e.g., the error 824*a* would reset the erroneous 127 value to 124 at 822*b*, the error 824*b* would reset the erroneous 131 to 128 at 822*a*, the error 824*c* would reset the erroneous 135 value to 132 at 822*c*).

FIG. 8C depicts a Gray code table 805 showing ×8 value change and a binary code table 806 shows a corresponding ×8 value change. In the Gray code table 805 and the binary code table 806, the counter value can transition a starting point 831*a* of 128 to 120 (e.g., decrement 831*b*) or 136 (e.g., increment 831*c*). The potential errors 833 in the two bits changing are 127, 135, or 143, none of which would be likely to cause a catastrophic error. Further, as shown in the binary code table 804, even if the counter ended up being set to one of those three erroneous values, because the counter is in a ×8 mode, the three lower bits could be masked, allowing the values to be reset to one of the expected values or the previous starting value (e.g., the error 834*a* would reset the erroneous 127 value to 120 at 832*b*, the error 834*b* would reset the erroneous 135 to 128 at 832*a*, the error 834*c* would reset the erroneous 143 value to 136 at 832*c*).

The power supply terminals are supplied with power supply potentials VDD2 and VSS. These power supply potentials VDD2 and VSS are supplied to an internal voltage generator circuit 170. The internal voltage generator circuit 170 generates various internal potentials VKK, VARY, VPERI, and the like based on the power supply potentials VDD2 and VSS. The internal potential VKK is mainly used in the row decoder 140, the internal potential VARY are mainly used in the sense amplifiers included in the memory array 150, and the internal potential VPERI is used in many other circuit blocks.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

Figure 2:
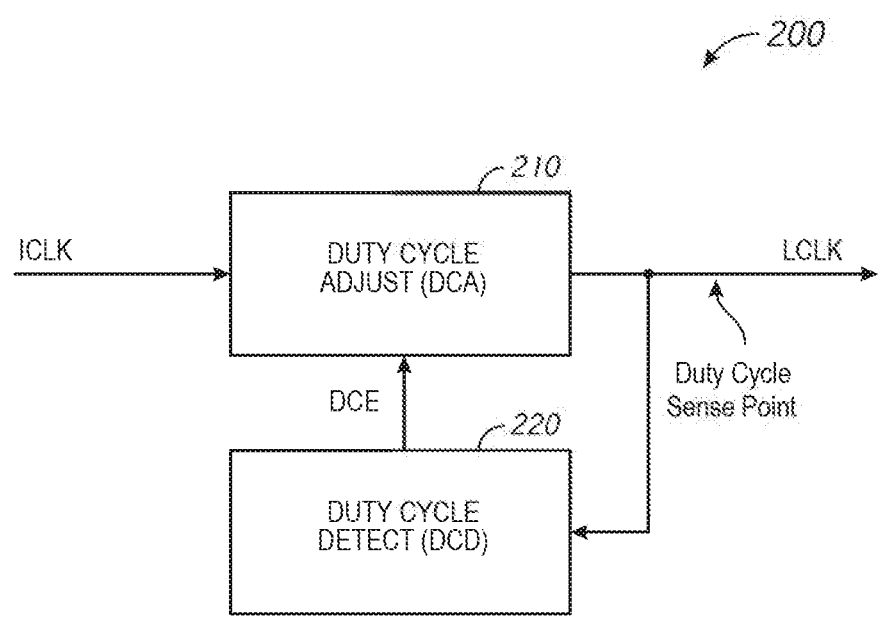
FIG. 2 illustrates a schematic block diagram of a duty cycle correction (DCC) circuit in accordance with an embodiment of the disclosure.

FIG. 2 illustrates a schematic block diagram of a duty cycle correction DCC circuit 200 in accordance with an embodiment of the disclosure. The DCC circuit 200 includes a duty cycle adjust circuit DCA 210 and a duty cycle detect circuit DCD 220. The internal clock generator 130 of FIG. 1 may implement the DCC circuit 200.

The DCA circuit 210 may receive the internal clock signal ICLK and a duty cycle error signal DCE from the DCD circuit 220, and may adjust a duty cycle of the ICLK signal to provide a local clock LCLK.

The DCD circuit 220 may receive the LCLK signal and may detect a duty cycle error (DCE) and provide the DCE signal to the DCA circuit 210. In some examples, the DCD circuit 220 may include a counter that is configured to store bits using Gray code. The counter may include binary-to-Gray code converters and Gray-to-binary code converters. In response to control signals to adjust (e.g., increment or decrement) the counter, the counter may encode and decode the individual bits stored in the counter using the binary-to-Gray code converters and the Gray-to-binary code converters. In some examples, the counter may also receive control signals to shift the counter in steps other than a ×1 step, such as ×4, ×8, etc., steps. The DCD circuit 220 may determine the DCE signal value during a duty cycle detection operation.

In operation, DCC circuit 200 is configured to modify a duty cycle of the ICLK signal to provide the LCLK signal such that the duty cycle of the LCLK signal allows successful communication with connected devices. The DCA circuit 210 may adjust a duty cycle of the ICLK signal based on the DCE signal to provide the LCLK signal.

The DCD circuit 220 may analyze the LCLK to determine the duty cycle error and set the DCE signal based on the detected duty cycle error during a duty cycle detection operation. In some examples, a duty cycle detection operation may only take place during specific time periods, such as after a power up. The duty cycle detection operation may be set for a specific time period. In some examples, the duty cycle detection operation may be set for 6, 8, 10, or more clock cycles of the LCLK signal. In some examples, the DCD circuit 220 may include a duty cycle detector that detects a duty cycle of the LCLK signal. The detected duty detector may express a duty cycle error as a ratio of time the LCLK signal is high versus the time the LCLK signal is low during a single clock cycle. An ideal ratio is 1:1 or 50% to 50%. If the duty cycle error has a value other than a 1:1 ratio, the duty cycle may need to be adjusted. The DCD circuit 220 may include a shift register or counter that keeps track of a current duty cycle error. The counter may be adjusted (e.g., incremented or decremented) as a detected duty cycle error changes. The value of the counter may be used to set a value of the DCE signal. The binary-to-Gray code converters may encode bit values stored in the counters, and the Gray-to-binary code converters may provide bits between individual bit cells of the counter. In some examples, the counter adjust by one bit at a time. In other examples, the counter may adjust by larger step sizes, such as ×4, ×8, etc., steps based on control signals. Storing values in the counter using Gray code may make the DCC circuit 200 less susceptible to catastrophic failure events caused by corruption of one or more bits within the counter. One cause of bit corruption in a counter is situations where many bits within the counter transition in a single adjustment (e.g., decrement or increment), especially in the presence of a timing hazard, e.g., setup time violation or an unexpected clock glitch. By using Gray code to encode bits in the counter, only a single bit is changed per adjustment of the counter, mitigating a failure caused by improper bit switching.

Figure 3:
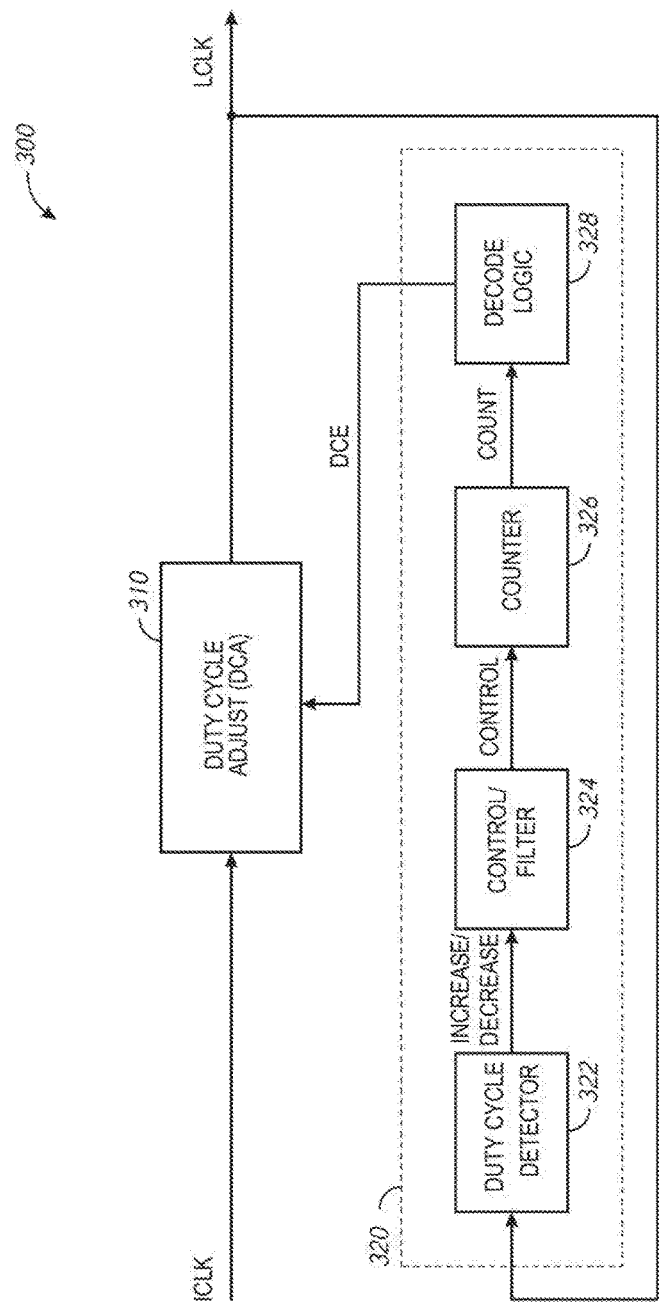
FIG. 3 illustrates a schematic block diagram of a DCC circuit in accordance with an embodiment of the disclosure.

FIG. 3 illustrates a schematic block diagram of a DCC circuit 300 in accordance with an embodiment of the disclosure. The DCC circuit 300 includes a duty cycle adjust circuit DCA 310 and a duty cycle detect circuit DCD 320. The internal clock generator 130 of FIG. 1 and/or the DCC circuit 200 of FIG. 2 may implement the DCC circuit 300.

The DCA circuit 310 may receive the internal clock signal ICLK and a duty cycle error signal DCE from the DCD circuit 320, and may adjust a duty cycle of the ICLK signal to provide a local clock signal LCLK.

The DCD circuit 320 may include a duty cycle detector 322, a control/filter circuit 324, a counter 326, and decode logic 328. The duty cycle detector 322 may receive the LCLK signal and may detect a duty cycle error (DCE) and provide an increment/decrement signal INCREASE/DECREASE to the control/filter circuit 324 indicating whether the LCLK signal has a duty cycle error. The control/filter circuit 324 may provide control signals CONTROL to the counter 326 to initialize the counter 326 after a power up, and as well as cause the counter 326 to adjust (e.g., increment or decrement). The counter 326 is configured to store a count value COUNT indicating a duty cycle error. The counter 326 may include bit cells that each include binary-to-Gray code converters and Gray-to-binary code converters to store a respective bits using Gray code. In response to control signals from the control/filter circuit 324 to adjust (e.g., increment or decrement) the counter 326, the counter 326 may encode and decode the individual bits using the binary-to-Gray code converters and the Gray-to-binary code converters. In some examples, the control/filter circuit 324 may also provide control signals to the counter to cause the counter 326 to adjust in steps other than a ×1 bit step, such as ×4 bit, ×8 bit, etc., steps. The decode logic 328 may receive a count value COUNT provided by the counter 326 and may provide a value on the DCE signal.

In operation, DCC circuit 300 is configured to modify a duty cycle of the ICLK signal to provide the LCLK signal such that the duty cycle of the LCLK signal allows successful communication with connected devices. The DCA circuit 310 may adjust a duty cycle of the ICLK signal based on the DCE signal to provide the LCLK signal.

The duty cycle detector 322 may analyze the LCLK to determine the duty cycle error and set the increment/decrement signal INCREASE/DECREASE based on the detected duty cycle error during a duty cycle detection operation. In some examples, a duty cycle detection operation may only take place during specific time periods, such as after a power up. The duty cycle detection operation may be set for a specific time period. In some examples, the duty cycle detection operation may be set for 6, 8, 10, or more clock cycles of the LCLK signal. The duty cycle detector 322 may express a duty cycle error as a ratio of time the LCLK signal is high versus the time the LCLK signal is low during a single clock cycle. An ideal ratio is 1:1 or 50% to 50%. If the duty cycle error has a value other than a 1:1 ratio, the duty cycle may need to be adjusted. The control/filter circuit 324 may initialize the counter 326 using control signals after a power up or based on other predefined events, in some examples. In response to the increment/decrement signal from the duty cycle detector 322, the control/filter circuit 324 may also provide control signals CONTROL that include an UP/DOWN signal to the counter 326 to cause the counter 326 to adjust. The binary-to-Gray code converters of the counter 326 may encode bit values stored in the counters, and the Gray-to-binary code converters may provide bits between individual bit cells of the counter 326. The control/filter circuit 324 may also provide control signals to the counter 326 to control the adjustment step size of the counter 326. In some examples, the counter 326 adjust by one bit at a time. In other examples, the counter 326 may adjust by larger step sizes, such as ×4 bit, ×8 bit, etc., steps. The decode logic 328 may receive the count value COUNT from the counter 326, and may decode the count value to set a value on the DCE signal. The 310 may adjust the duty cycle of the ICLK signal based on the DCE signal value. By using Gray code to encode bits in the counter 326, only a single bit is changed per adjustment of the counter 326, mitigating a failure caused by improper bit switching, especially in the event of an unpredicted timing hazard.

Figure 4:
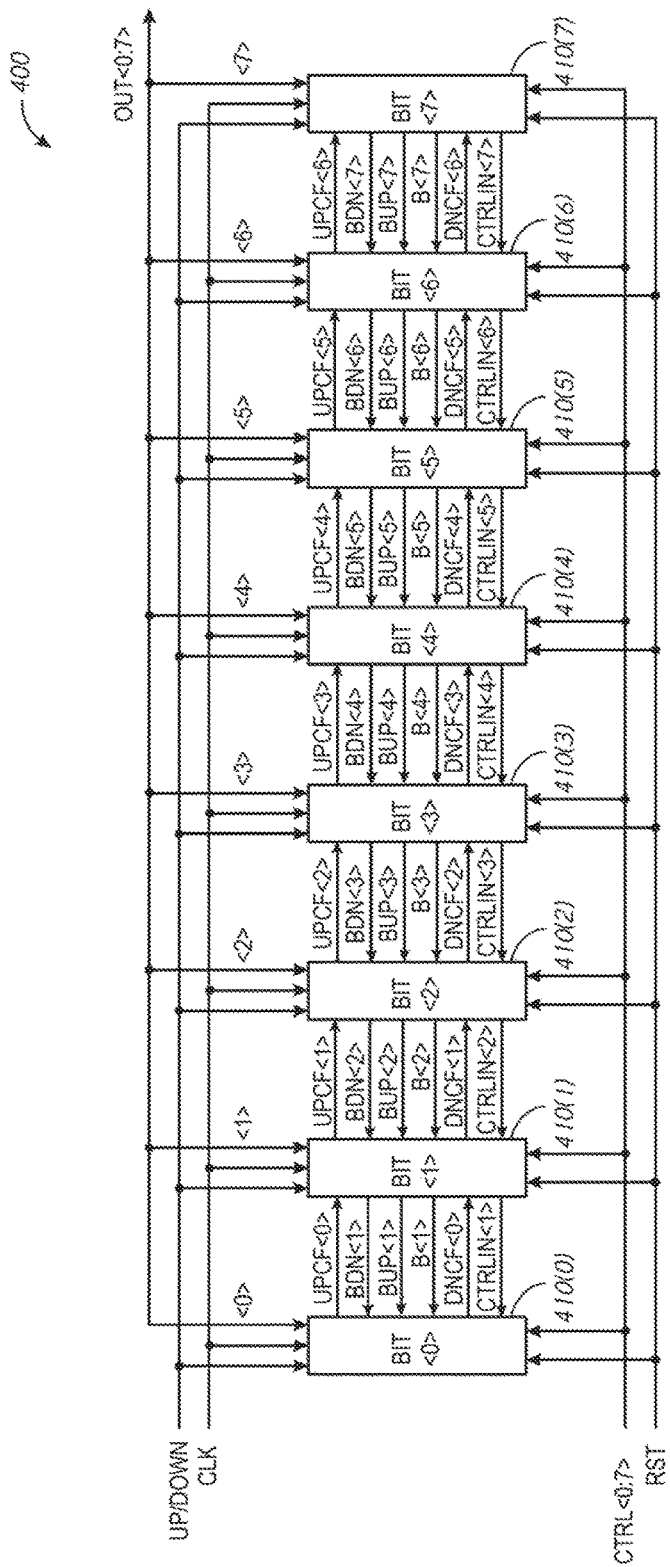
FIG. 4 illustrates a schematic block diagram of a counter circuit in accordance with an embodiment of the disclosure.

FIG. 4 illustrates a schematic block diagram of a counter circuit 400 in accordance with an embodiment of the disclosure. The counter circuit 400 includes a bit cells 410(0)-(7). The internal clock generator 130 of FIG. 1, the DCC circuit 200 of FIG. 2, and/or the counter 326 of FIG. 3 may implement the counter circuit 400. While the counter circuit 400 includes 8 bit cells 410(0)-(7), it is appreciated that the number of bits in the count circuit 400 may be increased or decreased without departing from the scope of the disclosure.

Figure 7:
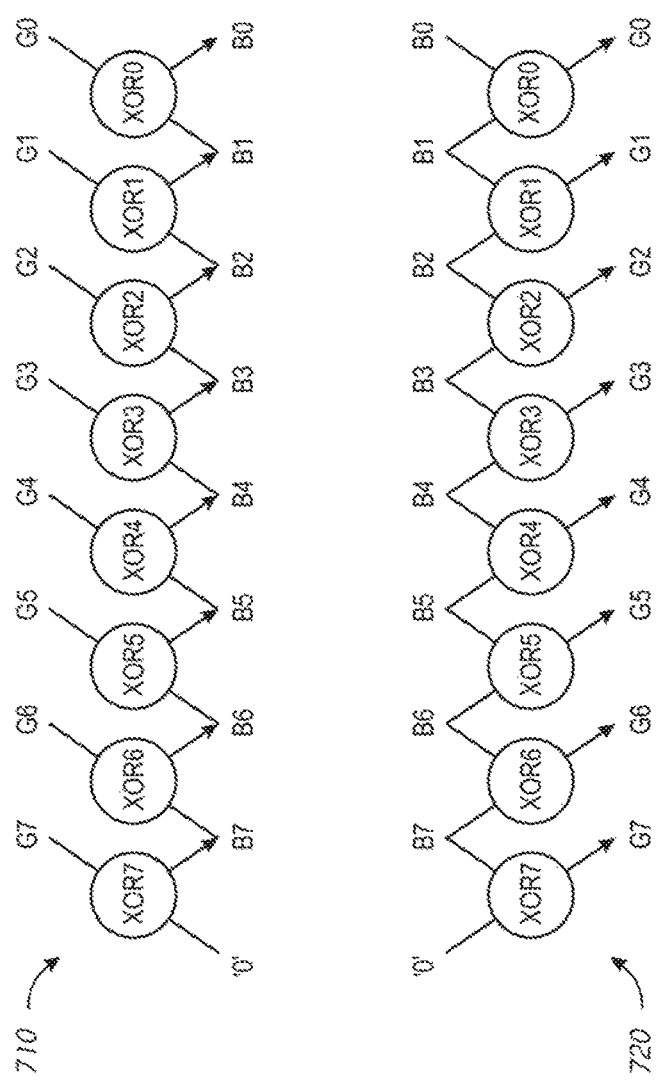
FIG. 7 illustrates a flow diagram of a counter conversion from Gray code to binary code and from binary code to Gray code accordance with an embodiment of the disclosure.

Conversion from Gray to binary code and from binary to Gray code is depicted in the logic flows diagrams 710 and 720, respectively, of FIG. 7. As shown in the flow diagram 710, the bitwise conversion of each bit from Gray code G0:G7 to binary code B0:B7 is an XOR logic comparison between a same order bit of the Gray code G0:G7 with a next higher order bit of the binary code B0:B7, starting with the highest order bit of the binary code B7 equal to the highest order bit of the Gray code G7. For example, the B6 bit is based on the G6 bit compared with the B7 bit (equal to the G7 bit provided from the XOR7 logic) using XOR6 logic; the B5 bit is based on the G4 bit compared with the B6 bit using the XOR5 logic; the B4 bit is based on the G4 bit compared with the B5 bit using the XOR4 logic; and so on. Thus, the Gray-to-binary conversion, as shown in the flow chart 710, is a sequential conversion starting with the highest order bit of the Gray code G7. As shown in the flow diagram 720, the bitwise conversion of each bit from binary code B0:B7 to Gray code G0:G7 is an XOR logic comparison between a same order bit and a next higher order bit of the binary code B0:B7, starting with the highest order bit of the Gray code G7 equal to the highest order bit of the binary code B7. For example, the G6 bit is based on the B6 bit compared with the B7 bit using XOR6 logic; the G5 bit is based on the B5 bit compared with the B6 bit using XOR5 logic; the G4 bit is based on the B4 bit compared with the B5 bit using XOR4 logic; and so on. Thus, the binary-to-Gray conversion, as shown in the flow chart 720, can be a simultaneous conversion of all binary code bits to Gray code bits. Therefore, as shown in FIG. 7, in order for the counter circuit 400 to be a synchronous counter that stores bit information using Gray code and outputs bit information using binary code, each of the bit cells 410(0)-(7) may perform conversions based on information from adjacent bit cells, including projected binary bit values for a counter increment and for a counter decrement.

Thus, each of the bit cells 410(0)-(7) may pass respective signals to adjacent bit cells, including a current bit value signal B<1:7>, a next state bit value up BUP<1:7> (e.g., indicates a next bit state value for the bit B<1:7>), a next state bit value down BDN<1:7> (e.g., indicates a next bit state value for the bit B<0:7> using active low logic), an active low increment count signal UPCF<0:6> (e.g., indicates whether a next bit value of the B<0:7> is a logical high or logical low value for the current bit cell), an active low decrement count signal DNCF<0:6> (e.g., indicates whether a next bit value of the B<0:7> is a logical high or logical low value for the current bit cell using active low logic), and an internal step size control signal CTRLIN<1:7>. Each of the bit cells 410(0)-(7) may also receive a common an UP/DOWN signal to indicate an increment or decrement of the counter circuit 400, and a common clock signal CLK to synchronize adjustment of each bit cell 410(0)-(7) of the counter circuit 400. Each of the bit cells 410(0)-(7) may further include a control signal CTRL<0:7> signal to set a step size of the counter circuit 400. A reset signal RST is also provided to each of the bit cells 410(0)-(7) to reset the value of the bit cells, for example, to an initial value. The counter may provide an output signal OUT<0:7> indicating a count value.

In operation, each of the bit cells 410(0)-(7) of the counter may receive the UP/DOWN signal and the CLK signal, and the counter circuit 400 may adjust (e.g., increment or decrement) the OUT<0:7> signal value based on the UP/DOWN signal and in response to the CLK signal. Each of the bit cells 410(0)-(7) may store a count value using Gray code encoding, and may pass bit values between individual bit cells 410(0)-(7) using binary code encoding. To covert between binary code encoding and Gray code encoding, and vice versa, each of the bit cells 410(0)-(7) may include respective binary-to-Gray code converters and Gray-to-binary code converters. For a bit of a bit cell, a conversion between binary code and Gray code includes an exclusive OR XOR of a value of a next binary state value of the bit of the bit cell and a next state value of a bit of a subsequent bit cell (e.g., next higher order bit cell). Further, a conversion between Gray code and binary code includes an XOR of a value of a current Gray code bit of the bit cell and a binary bit value of a subsequent bit cell (e.g., next higher order bit cell). The B<0:7>, BUP<0:7>, BDN<0:7>, UPCF<0:6>, and DNCF<0:6> signals may be used to perform the Gray-to-binary conversions and the binary-to-Gray conversions. The CTRLIN<0:7> signals may be used to set a step size such that lower bits may be disabled during an adjustment of the counter circuit 400. For example, the CTRL<0:1> signals may be set to disable the bit cells 410(0)-(1) to implement a ×4 bit step. Other step sizes may be implemented using other combinations of the CTRL<0:7> signals.

The CTRLIN<0:7> signals may indicate whether a previous (e.g., next lower order) bit cell 410(0)-(7) is disabled for the adjustment of the counter circuit 400. By including logic in the bit cells 410(0)-(7) to encode stored bits using Gray code, only a single bit in the counter 400 is changed per adjustment of the counter 400, mitigating a failure caused by improper bit switching during an adjustment.

Figure 5:
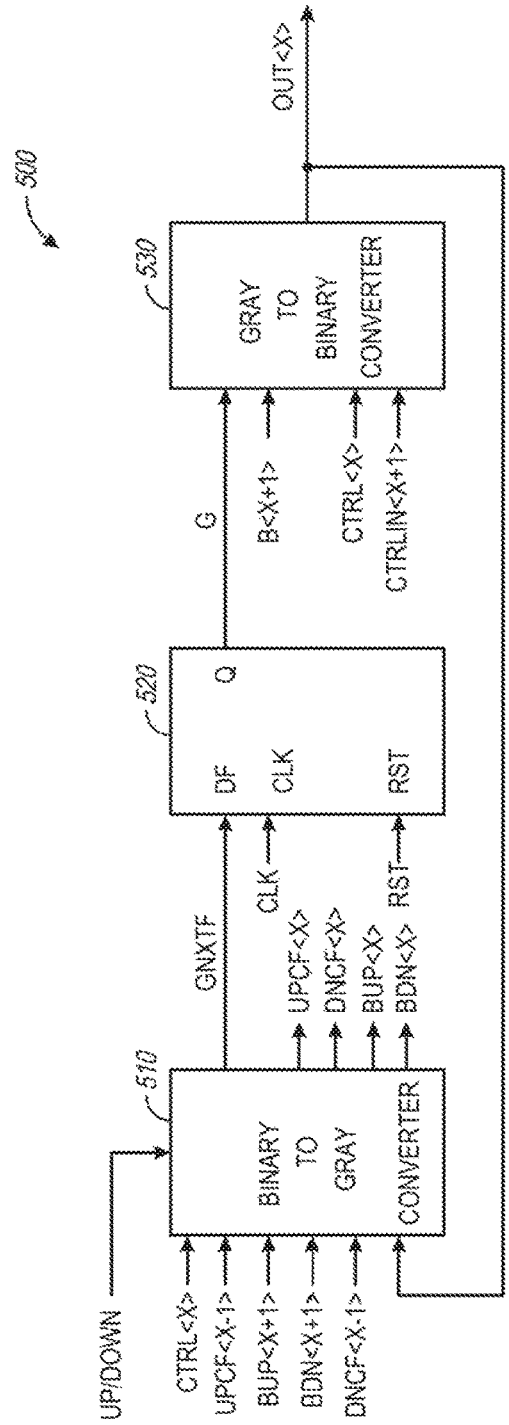
FIG. 5 illustrates a block diagram of a single bit cell of a counter circuit in accordance with an embodiment of the disclosure.

FIG. 5 illustrates a block diagram of a single bit cell 500 of a counter circuit in accordance with an embodiment of the disclosure. The bit cell 500 may include a binary-to-Gray code converter 510, a flip-flop 520, and a Gray-to-binary code converter 530. The bit cell 500 may be implemented in any combination of the bit cells 410(0)-(7) of FIG. 4. In the foregoing description, the <X> indicates a value from the current bit cell, the <X−1> indicates a value from a previous bit cell (e.g., next lower order bit cell), and <X+1> indicates a value from a subsequent bit cell (e.g., next higher order bit cell). If the bit cell is a first bit cell, the previous bit cell values may have logical zero values (e.g., a low value for an active high signal and a high value for an active low signal). If the bit cell is a last bit cell, the subsequent bit cell values may have logical zero values (e.g., a low value for an active high signal and a high value for an active low signal).

The binary-to-Gray code converter 510 may receive the UP/DOWN signal (e.g., indicating whether the counter adjustment is an increment or decrement), the UPCF<X−1> signal, the BUP<X+1> signal, the BDN<X+1> signal, the B<X> signal, the DNCF<X−1> signal, the CTRL<X> signal, and an output signal OUT<X> from the Gray-to-binary code converter 530. Based on the received the UPCF<X−1>, BUP<X+1>, BDN<X+1>, DNCF<X−1>, OUT<X> signals, the binary-to-Gray code converter 510 may provide an active low next Gray code bit value signal GNXTF to the flip-flop 520. The binary-to-Gray code converter 510 may also provide the UPCF<X> and DNCF<X> signals based on the UPCF<X−1> and DNCF <X−1> signals, respectively, and on the CTRL<X> signal. The UPCF<X> and DNCF<X> signals may be provided to a subsequent bit cell (e.g., next higher order bit cell). The binary-to-Gray code converter 510 may include logic circuitry to determine the value of the GNXTF signal, including XOR logic gates.

The flip-flop 520 may receive the GNXTF signal at a DF input and the CLK signal at a CLK input. In response to the CLK signal, the flip-flop 520 may provide a Gray code bit signal G from a Q output having a value based on a value of the GNXTF signal. The flip-flop flop 520 may be reset by the RST signal to an initial state, for example, when the bit cell 500 is initialized.

The Gray-to-binary code converter 530 may receive the G signal, the B<X+1> signal, and the CTRL<X> and CTRLIN<X+1> signals. Based on the G signal and the B<X+1> signal, the Gray-to-binary code converter 530 may set an output bit value B<X>. Based on the CTRL<X> and CTRLIN<X+1> signals and the B<X> signal, the Gray-to-binary code converter 530 may provide an output signal OUT<X>. The CTRL<X> and CTRLIN<X+1> signals may indicate whether the current bit cell is disabled. The Gray-to-binary code converter 530 may include logic circuitry to determine the value of the GNXTF signal, including XOR logic gates. By including the binary-to-Gray code converter 510 and the flip-flop 520, along with the Gray-to-binary code converter 530, in the bit cell 500 to store the G signal bit as a Gray code encoded bit, only a single bit in the counter is changed per adjustment of the counter, mitigating a failure caused by improper bit switching during an adjustment.

Figure 6:
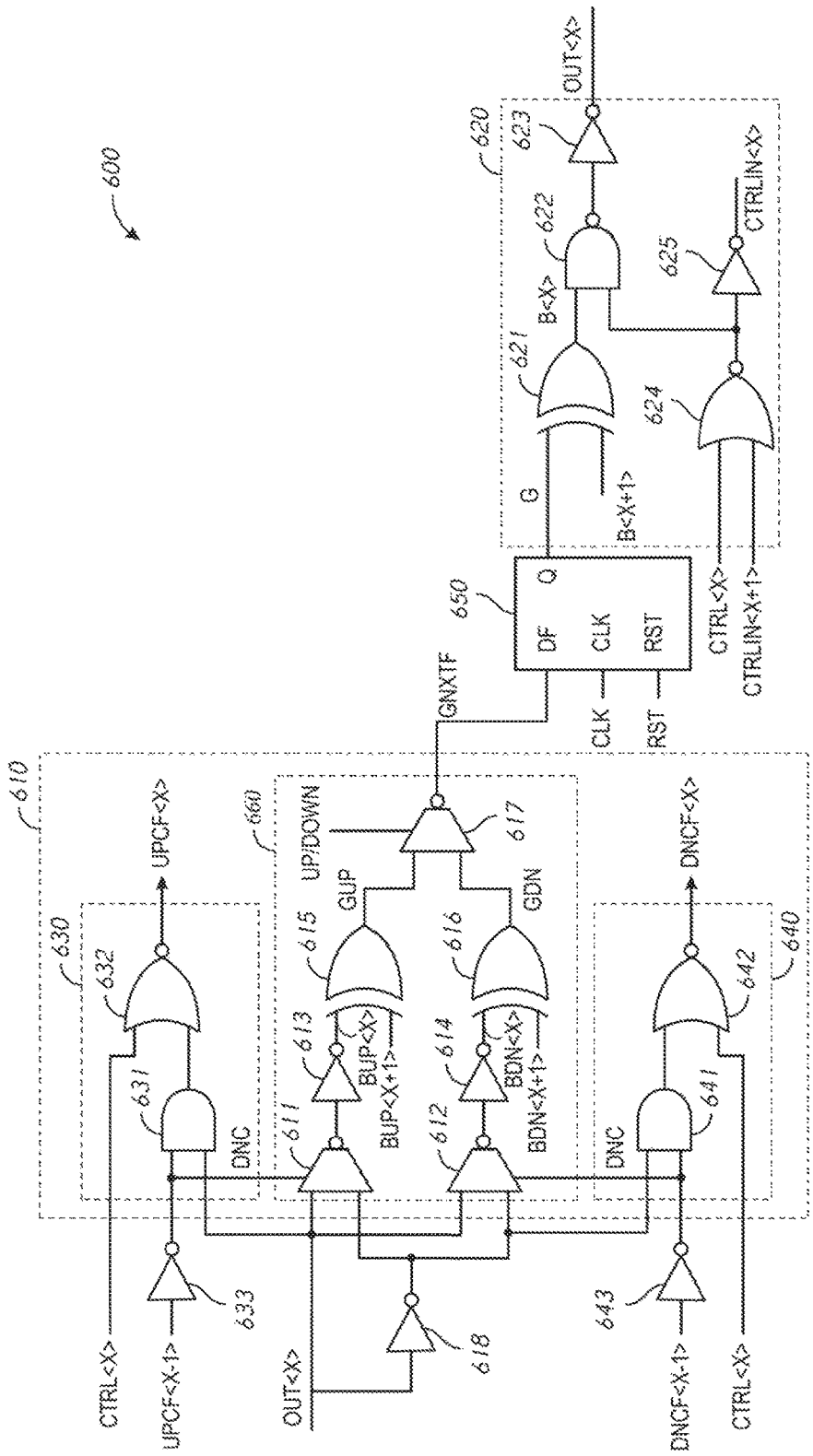
FIG. 6 illustrates a schematic block diagram of a single bit cell of a counter circuit in accordance with an embodiment of the disclosure.

FIG. 6 illustrates a schematic block diagram of a single bit cell 600 of a counter circuit in accordance with an embodiment of the disclosure. The bit cell 600 may include a binary-to-Gray code converter 610, a Gray-to-binary code converter 620, and a flip-flop 650. The bit cell 600 may be implemented in any combination of the bit cells binary-to-Gray code converter 610(0)-(7) of FIG. 4 and/or the bit cell 500 of FIG. 5. In the foregoing description, the <X> indicates a value from the current bit cell, the <X−1> indicates a value from a previous bit cell (e.g., next lower order bit cell), and <X+1> indicates a value from a subsequent bit cell (e.g., next higher order bit cell).

The binary-to-Gray code converter 610 may include an up logic circuit 630, a binary-to-Gray code logic circuit 660, and a down logic circuit 640. The up logic circuit 630 may include a AND gate 631 coupled to a NOR gate 632. The AND gate 631 may apply AND logic to the OUT<X> signal and the UPCF<X−1> signal inverted via the inverter 633 to provide an output signal. The NOR gate 632 may apply NOR logic to the CTRL<X> signal and the output of the AND gate 631 to provide the UPCF<X> signal.

The down logic circuit 640 may include a AND gate 641 coupled to a NOR gate 642. The AND gate 641 may apply AND logic to the OUT<X> signal inverted via the inverter 618 and the DNCF<X−1> signal inverted via the inverter 643 to provide an output signal. The NOR gate 642 may apply NOR logic to the CTRL<X> signal and the output of the AND gate 641 to provide the DNCF<X> signal. The UPCF<X−1> and DNCF<X−1> signals may indicate to the bit cell 600 whether the previous (e.g., next lower order) bit cell binary bit value will increment or decrement during the next adjustment. The UPCF<X> and DNCF<X> signals may indicate to the subsequent bit cell whether the current bit cell binary bit value will increment or decrement during the next adjustment.

The binary-to-Gray code logic circuit 660 may include a multiplexer 611, a multiplexer 612, an inverter 613, an inverter 614, a XOR gate 615, a XOR gate 616, and a multiplexer 617. The multiplexer 611, inverter 613, and XOR gate 615 may provide a next state Gray code bit value GUP should the next adjustment of the counter (e.g., via the UP/DOWN signal) indicate an increment. The multiplexer 612, inverter 614, and XOR gate 616 may provide a bit next state Gray code bit value GDN should the next adjustment of the counter indicate a decrement. The multiplexer 611 may provide one of the OUT<X> signal or the OUT<X> signal inverted by the inverter 618 based on a value of the UPC signal. The UPC signal may indicate whether the previous (e.g., next lower order) bit will increment if a next adjustment is an increment. The inverter 613 may invert the output of the multiplexer 611, and the XOR gate 615 may apply XOR logic to the output of the inverter 613 and the next state increment binary bit value from the subsequent (e.g., next higher order) increment binary bit cell signal BUP<X+1> to provide the GUP signal. That is, if the output of the inverter 613 and the BUP<X+1> have different logical values, the GUP signal has a high logical value. Otherwise, the GUP signal has a low logical value. The multiplexer 612 may provide one of the OUT<X> signal or the OUT<X> signal inverted by the inverter 618 based on a value of the DNC signal. The DNC signal may indicate whether the previous (e.g., next lower order) bit will decrement if a next adjustment is a decrement. The inverter 614 may invert the output of the multiplexer 612, and the XOR gate 616 may apply XOR logic to the output of the inverter 614 and the next state decrement binary bit value from the subsequent (e.g., next higher order) decrement binary bit cell signal BDN<X+1> to provide the GDN signal. That is, if the output of the inverter 614 and the BDN<X+1> have different logical values, the GDN signal has a high logical value. Otherwise, the GDN signal has a low logical value. The multiplexer 617 may provide one of the GUP or GDN signals at an output as an active low next state Gray code bit signal GNXTF to a DF input of the flip-flop 650 based on a value of the UP/DOWN signal.

The flip-flop 650 may provide the next state Gray code bit signal G at an output Q of the flip-flop 650 in response to the CLK signal received at the CLK input. The reset signal RST received at the RST input of the flip-flop 650 may reset the G signal provided from the Q output.

The Gray-to-binary code converter 620 may include a XOR gate 621, a NAND gate 622, an inverter 623, a NOR gate 624, and an inverter 625. The XOR gate 621 may apply XOR logic to the G signal and the subsequent (e.g., next higher order) bit signal B<X+1> to provide a current binary bit signal B<X>. That is, if the G signal and the subsequent (e.g., next higher order) binary bit signal B<X+1> have different logical values, the B<X> signal has a high logical value. Otherwise, the B<X> signal has a low logical value. The NOR gate 624 may apply NOR logic to the CTRL<X> and CTRLIN<X+1> signals to generate the CTRLIN<X> signal via the inverter 625. The NAND gate 622 may apply NAND logic to the B<X> signal and the output of the NOR gate 624 to provide the OUT<X> signal through inverter 623. The CTRL<X> and CTRLIN<X+1> signals may be used to determine whether the bit cell 600 is disabled (e.g., prevented from toggling when larger step sizes are desired).

In operation, the bit cell 600 adjusts a Gray code bit value based on binary bit values of the bit cell 600 and bit values of adjacent bit cells. A bitwise conversion of a count value from Gray-to-binary code may involve a sequential conversion, wherein one bit conversion is used in a next lower order bit conversion (e.g., binary bit 7 is used with a Gray code bit 6 to determine binary bit 6, binary bit 6 is used with Gray code bit 5 to determine binary bit 5, etc.). To make the counter synchronous, the bit cell 600 may store the current Gray code bit value as the G signal, and may use next state binary bit values from adjacent bit cells to allow a synchronous increment and decrement of the counter.

The binary-to-Gray code converter 610 and the down logic circuit 640, along with the multiplexer 611 and the multiplexer 612, may provide the next bit state value of the B<X> signal as the BUP<X> (e.g., active high logic) and BDN<X> (e.g., active low logic) based on the UPCF<X>, DNCF<X>, and OUT<X> signals.

The inverter 613 and XOR gate 615 may provide next state Gray code bit value GUP should the next adjustment of the counter (e.g., via the UP/DOWN signal) indicate an increment based on the BUP<X> signal and the BUP<X+1> signal from the next higher order bit cell using XOR logic. The inverter 614 and XOR gate 616 may provide next state Gray code bit value GDN should the next adjustment of the counter (e.g., via the UP/DOWN signal) indicate a decrement based on the BDN<X> signal and the BDN<X+1> signal from the next higher order bit cell using XOR logic. The multiplexer 617 may provide, one of the GUP or GDN signals at an output as an active low next state Gray code bit signal GNXTF to the flip-flop 650 based on a value of the UP/DOWN signal.

The flip-flop 650 may provide the next state Gray code bit signal G in response to the CLK signal. The XOR gate 621 may provide the B<X> signal based on the G signal and the subsequent (e.g., next higher order) bit signal B<X+1> using XOR logic. The NOR gate 624 and the NAND gate 622 may determine whether the B<X> signal is provided as the OUT<X> signal based on the CTRL<X> and CTRLIN<X+1> signals (e.g., determining whether the bit cell is enabled or disabled due to selection of step sizes other than 1× bit steps).

By including the binary-to-Gray code converter 610 and the Gray-to-binary code converter 620, along with the flip-flop 650, in the bit cell 600 to store the G signal bit as a Gray code encoded bit, only a single bit in the counter is changed per adjustment of the counter, mitigating a failure caused by improper bit switching during an adjustment, regardless of the selected increment size (e.g., ×1, ×4, ×8, etc., step sizes).

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a counter, wherein the counter is configured to:
   encode a first value to a second value, wherein the first value is represented by a binary code and the second value is represented by a Gray code,
   count up or count down the second value by a specified step to output a third value, wherein the third value is represented by the Gray code, and
   decode the third value to a fourth value with masking a part of the fourth value responsive to a control signal, wherein the fourth value is represented by the binary code.

2. The apparatus of claim 1, wherein to encode the first value to the second value comprises using bitwise XOR logic to compare binary code bit values and Gray code bit values.

3. The apparatus of claim 1, wherein to decode the third value to the fourth value comprises using bitwise XOR logic to compare binary code bit values.

4. The apparatus of claim 1, wherein to count up or count down the second value by the specified step to output the third value is in response to a clock signal and based on an UP/DOWN signal, wherein the UP/DOWN signal indicates an increment or decrement of the counter.

5. The apparatus of claim 1, wherein the specified step is greater than a one bit step.

6. An apparatus comprising:
   a duty cycle detect circuit configured to receive a clock signal and to detect a duty cycle error of the clock signal, the duty cycle detect circuit including a counter configured to store a count value indicating the duty cycle error using Gray code, wherein the counter is adjusted in response to detection of non-zero duty cycle error and the counter is further configured to convert the count value from Gray code to binary code as a binary count value, wherein the duty cycle detect circuit is further configured to provide a duty cycle error signal based on the binary count value; and
   a duty cycle correction circuit configured to adjust a duty cycle of the clock signal based on the duty cycle error signal.

7. The apparatus of claim 6, wherein the counter comprises a plurality of bit cells, wherein a bit cell of the plurality of bit cells is configured to adjust a Gray code bit value based on the duty cycle error.

8. The apparatus of claim 7, wherein the bit cell of the plurality of bit cells comprises a binary-to-Gray code converter to determine a next value of the Gray code bit based on a current binary bit value and a next state binary bit value from a next higher order bit cell of the plurality of bit cells.

9. The apparatus of claim 8, wherein the binary-to-Gray code converter comprises:
   a first XOR logic gate configured to compare a current binary bit value with a next state increment binary bit value from the next higher order bit cell to provide an up Gray code bit;
   a second XOR logic gate configured to compare the current binary bit value with a next state decrement binary bit value from the next higher order bit cell to provide a down Gray code bit; and
   a multiplexer to select one of the up Gray code bit or the down Gray code bit as the next value of the Gray code bit in response to an UP/DOWN signal, wherein the UP/DOWN signal indicates whether the counter is incremented or decremented.

10. The apparatus of claim 9, wherein the bit cell of the plurality of bit cells further comprises a flip-flop circuit configured to set the next value of the Gray code as a current value of the Gray code bit in response to a second clock signal, wherein the second clock sitmal controls timing of the adjustment of the counter.

11. The apparatus of claim 8, wherein the bit cell of the plurality of bit cells comprises a Gray-to-binary code converter to determine the current binary bit value based on the current value of the Gray code bit and a current binary bit value from the next higher order bit cell.

12. The apparatus of claim 11, wherein the Gray-to-binary code converter to determine the current binary bit value based on the current value of the Gray code bit and the current binary bit value from the next higher order bit cell is via an XOR comparison.

13. The apparatus of claim 7, wherein a step size adjustment of the counter is based on control signals received at each of the plurality of bit cells.

14. The apparatus of claim 13, wherein the step size adjustment of the counter comprises at least one of a 2 bit step size, a 4 bit step size, or an 8 bit step size.

15. A method comprising:
   receiving a clock signal;
   detecting a duty cycle error of the clock signal;
   storing a count value indicating the duty cycle error using Gray code;
   in response to detecting a non-zero duty cycle error, adjusting the count value by a step size;
   converting the count value from Gray code to binary code to provide a binary count value;
   providing a duty cycle error signal based on the binary count value; and
   adjusting a duty cycle of the clock signal based on the duty cycle error signal.

16. The method of claim 15, wherein adjusting the count value by the step size comprises, for each bit of the counter, performing bitwise comparisons based on a current binary bit value for a bit of the counter with a next state binary bit value from a next higher order bit of the counter.

17. The method of claim 16, wherein the bitwise comparisons use XOR logic.

18. The method of claim 15, wherein converting the count value from Gray code to binary code comprises, for each bit of the counter, performing bitwise comparisons based on a current binary bit value for a bit of the counter with a current binary bit value from a next higher order bit of the counter to provide the binary count value.

19. The method of claim 15, further comprising setting the step size of the counter to a value greater than a one-bit step.

\* \* \* \* \*